US012767524B2

(12) United States Patent
Arndt et al.

(10) Patent No.: US 12,767,524 B2
(45) Date of Patent: Oct. 20, 2026

(54) ENHANCED MEMS SENSOR EMBEDDED HEATER

(71) Applicant: Apple Inc., Cupertino, CA (US)

(72) Inventors: Gregory B. Arndt, San Jose, CA (US); Majid Khan, Sunnyvale, CA (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1317 days.

(21) Appl. No.: 17/461,866

(22) Filed: Aug. 30, 2021

(65) Prior Publication Data

US 2023/0061188 A1 Mar. 2, 2023

(51) Int. Cl.

| | |
|---|---|
| ***H05B 45/325*** | (2020.01) |
| ***B81B 7/00*** | (2006.01) |
| ***H04M 1/02*** | (2006.01) |
| ***H05B 3/28*** | (2006.01) |

(52) U.S. Cl.

CPC ........... *B81B 7/0087* (2013.01); *H04M 1/026* (2013.01); *H05B 3/28* (2013.01); *B81B 2201/0214* (2013.01); *B81B 2201/0264* (2013.01); *B81B 2207/015* (2013.01); *H04M 2250/12* (2013.01)

(58) Field of Classification Search

None

See application file for complete search history.

(56) References Cited

U.S. PATENT DOCUMENTS 4,408,490 A * 10/1983 Takahashi .............. G01C 19/58 73/504.06
2011/0223255 A1* 9/2011 Thiesen .................. A61P 35/00 514/183
2019/0100428 A1* 4/2019 Vummidi Murali .......................... B81C 1/0023
2019/0162267 A1* 5/2019 Barber ...................... F16F 9/53
2020/0152848 A1* 5/2020 Vashaee ................. H10N 10/17

* cited by examiner

*Primary Examiner* — Erica S Lin

(74) *Attorney, Agent, or Firm* — BAKERHOSTETLER

(57) ABSTRACT

Aspects of the subject technology relate to an apparatus including a housing and a substrate. The apparatus further includes a sensor, an integrated circuit mounted on the substrate, and one or more heating elements configured to adjust a temperature of the sensor to facilitate measurement of temperature sensitivity and calibration of the sensor.

20 Claims, 6 Drawing Sheets

ENHANCED MEMS SENSOR EMBEDDED HEATER

TECHNICAL FIELD

The present description relates generally to sensor technology and more particularly, but not exclusively, to an enhanced microelectro-mechanical system (MEMS) sensor device with an embedded heater.

BACKGROUND

Portable electronic devices such as smartphones and smartwatches include pressure sensors for perceiving environmental pressure. The pressure sensor is sometimes used for barometric pressure measurements, which can be used to identify changes in elevation or depth in water. The changes in elevation are sometimes used to identify a location or exercise performed by a user of the device. For example, an activity monitor application running on the processing circuitry of the device worn or carried by a user while the user walks or runs up a flight of stairs or a hill may measure elevation changes. Portable electronic devices most commonly use capacitive or piezoresistive microelectromechanical system (MEMS) pressure sensors. The performance of the pressure sensors is dependent upon sensor calibration, for example, temperature sensitivity calibration.

BRIEF DESCRIPTION OF THE DRAWINGS

Certain features of the subject technology are set forth in the appended claims. However, for purposes of explanation, several aspects of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block-diagram form in order to avoid obscuring the concepts of the subject technology.

The subject disclosure is directed to an enhanced microelectro-mechanical system (MEMS) sensor device with an embedded heater. The embedded heater of the subject technology can uniformly heat the MEMS sensor device to facilitate measurement of temperature sensitivity and calibration of the sensor device. The disclosed heating elements can be embedded in different portions of the MEMS sensor device, for example, in the housing (lid) or within the gel. In some implementations, the heating elements can be incorporated in the substrate or the integrated circuit included in the MEMS sensor device, as discussed herein.

Figure 1A:
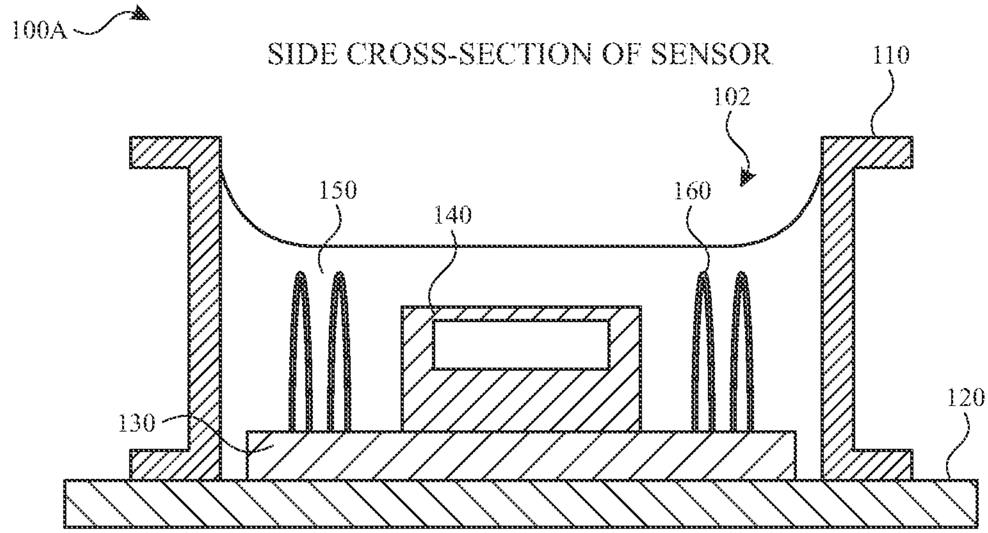
FIG. 1A illustrates a cross-sectional view of an example of an enhanced microelectro-mechanical system (MEMS) sensor device with an embedded heater, in accordance with various aspects of the subject technology.

FIG. 1A illustrates a cross-sectional view 100A of an example of an enhanced MEMS sensor device 102 with an embedded heater, in accordance with various aspects of the subject technology. The enhanced MEMS sensor device 102 (hereinafter, sensor device 102) includes a lid (housing) 110, a substrate 120, an application-specific integrated circuit (ASIC) 130, a MEMS sensor 140, a deformable nonconducting medium 150 (e.g., gel, hereinafter, medium 150) and a number of heating elements 160 (e.g., wire bond heating elements). The lid 110 can be made of, but is not limited to, a metal such as aluminum, tungsten, stainless steel, or other suitable metals. In some implementations, other materials such as plastic can be used to make the lid 110. The substrate 120 can be made of glass, a semiconductor material (wafer) such as silicon or any other suitable material. The substrate 120 covers a bottom side of the sensor device 100A. The ASIC 130 is placed on the substrate 120 and includes suitable circuitry (analog and/or digital) to drive the heating elements 160, for example, provide power and control signals to the heating elements 160. The heat generated by the heating elements 160 is leveraged to measure, for instance, temperature sensitivity of the MEMS sensor 140 and to perform sensor calibration.

The MEMS sensor 140 can be any sensor such as a pressure sensor, a gas sensor, an environmental sensor, or other sensors for which temperature sensitivity can be an issue and temperature calibration would be important. The medium 150 is used to partially fill the lid 110 to fully cover and insulate the ASIC 130, the MEMS 140 and the heating elements 160 from one another and also isolate them from the outside environment. The heating elements 160 can be made of any electrically resistive material such as niobium, carbon steel, nichrome wires or wire bonds or any other suitable resistive element. It is crucial to provide a uniform temperature distribution within the medium 150. The uniform temperature distribution would prevent thermal gradients across the ASIC 130, which can result in offsets in analog circuits implemented on the ASIC 130. In order to achieve the uniform temperature distribution, the heating elements 160 are implemented as an array of heating elements. In some implementations, the intensity of the drive current to the heating elements 160 can adjusted by a control feedback system (not shown for simplicity) so that the sensor temperature conforms to a specified temperature profile and ensure uniform heating. In some implementations, the control system may consist of a multi-input, multi-output control feedback implemented in hardware (HD) and/or software (SW) that can monitor temperature and adjust the drive current and, as a result, a dissipation of each heating element 160 to ensure uniform heating of the MEMS sensor 140.

In one or more implementations, the array of heating elements 160 can also be used as strain sensors by measuring the change in resistance of the heating elements 160 due to a strain associated with the ASIC 130, which can be transferred to the MEMS sensor 140. Measurement of the strain associated with ASIC 130 can be used to compensate pressure measurements by the MEMS sensor 140 to eliminate errors caused by the mechanical strain transferred to the MEMS sensor 140.

Figure 1B:
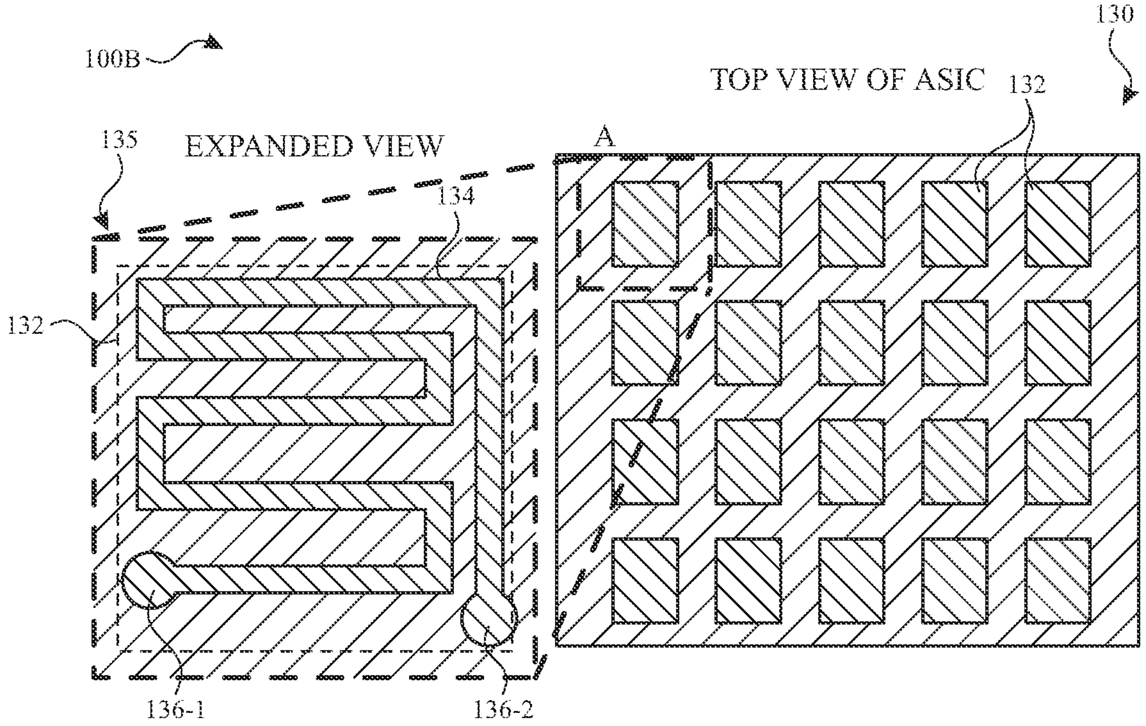
FIG. 1B illustrates a top view of an example ASIC of the enhanced MEMS sensor device of FIG. 1A, in accordance with various aspects of the subject technology.

FIG. 1B illustrates a top view 100B of an example ASIC 130 of the sensor device 100A of FIG. 1A, in accordance with various aspects of the subject technology. The top view 100B shows an example implementation, where an array of heating elements 132 are realized on the ASIC 130, instead of or in addition to the heating elements 160, which are distributed withing the medium 150. The structure of each heating element 132 is shown in the expanded view 135, which shows a trace of a resistive element 134 with connection pads 136 (136-1 and 136-2). The drive current and/or voltage and the control signals to each heating element 132 can be provided through the connection pads 136. The intensity of the drive current/voltage can be adjusted by the control feedback system (not shown for simplicity) so that the sensor temperature conforms to a specified temperature profile and ensure uniform heating. In some implementations, the control system may consist of a multi-input, multi-output control feedback implemented in HD and/or SW that can monitor temperature and adjust the power dissipation of each heating element 160 to ensure uniform heating of the MEMS sensor 140.

Figure 1C:
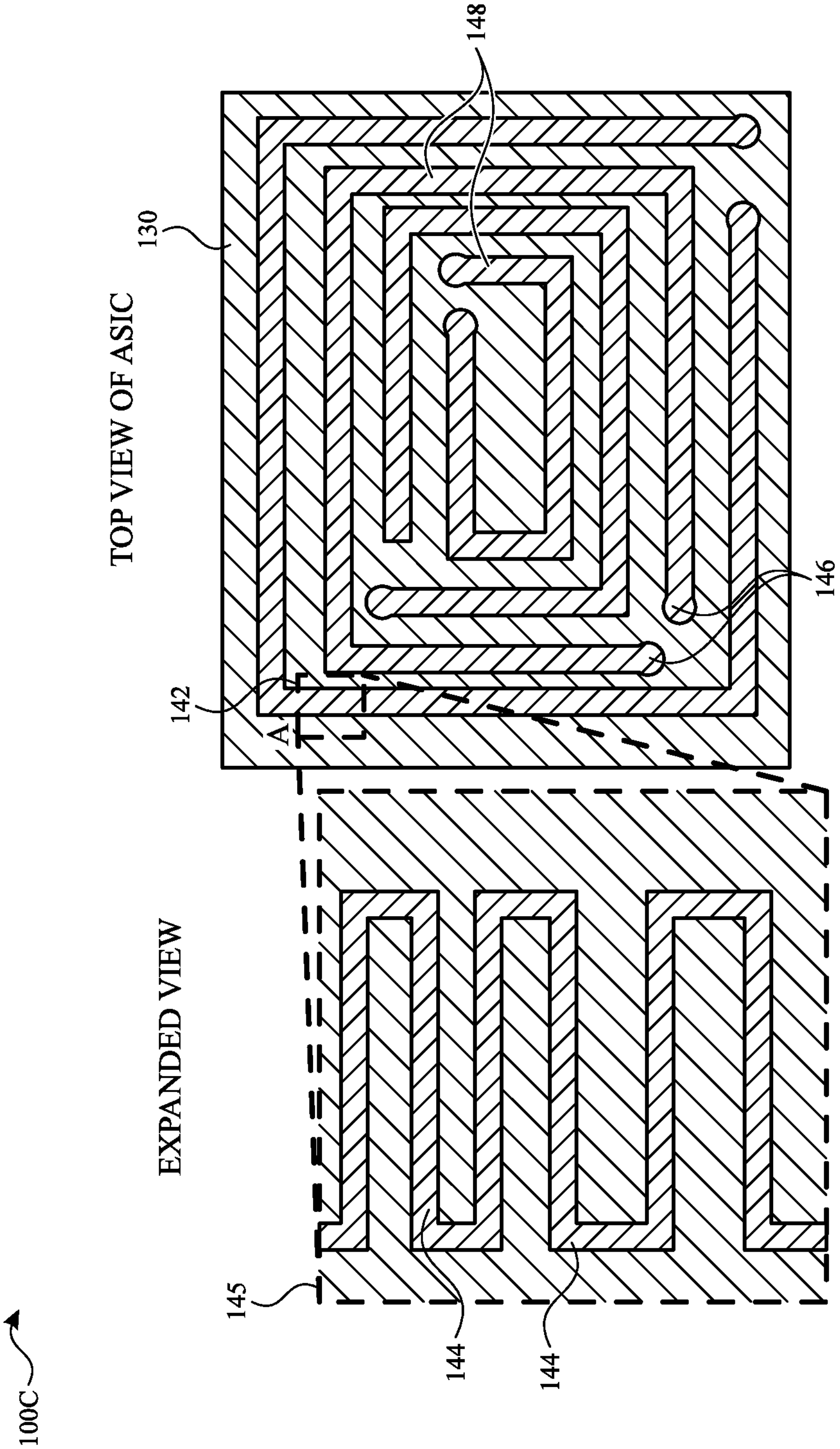
FIG. 1C illustrates a top view of an example ASIC of the enhanced MEMS sensor device of FIG. 1A, in accordance with various aspects of the subject technology.

FIG. 1C illustrates a top view 100C of an example implementation of the ASIC 130 of the sensor device 100A of FIG. 1A, in accordance with various aspects of the subject technology. In the example implementation of the ASIC 130, as shown in the top view 100C, an array of heating elements 148 are realized on the ASIC 130, instead of or in addition to the heating elements 160, which are distributed within the medium 150. Each heating element 148, as shown in the top view, has the form of a single loop coil with two ending pads 146. A detailed structure of a portion 142 of the heating element 148 is shown in the expanded view 145, which depicts a winding trace of a resistive element 144. The winding trace enables extending the length, and as a result, the resistance of the heating elements 148 while conserving on the used surface area of the ASIC. The connection pads 146 are used to provide the drive current and/or voltage and the control signals to each heating element 148. The intensity of the drive current can be adjusted by a control feedback system, as discussed below, so that the sensor temperature conforms to a specified temperature profile and ensure uniform heating.

Figure 1D:
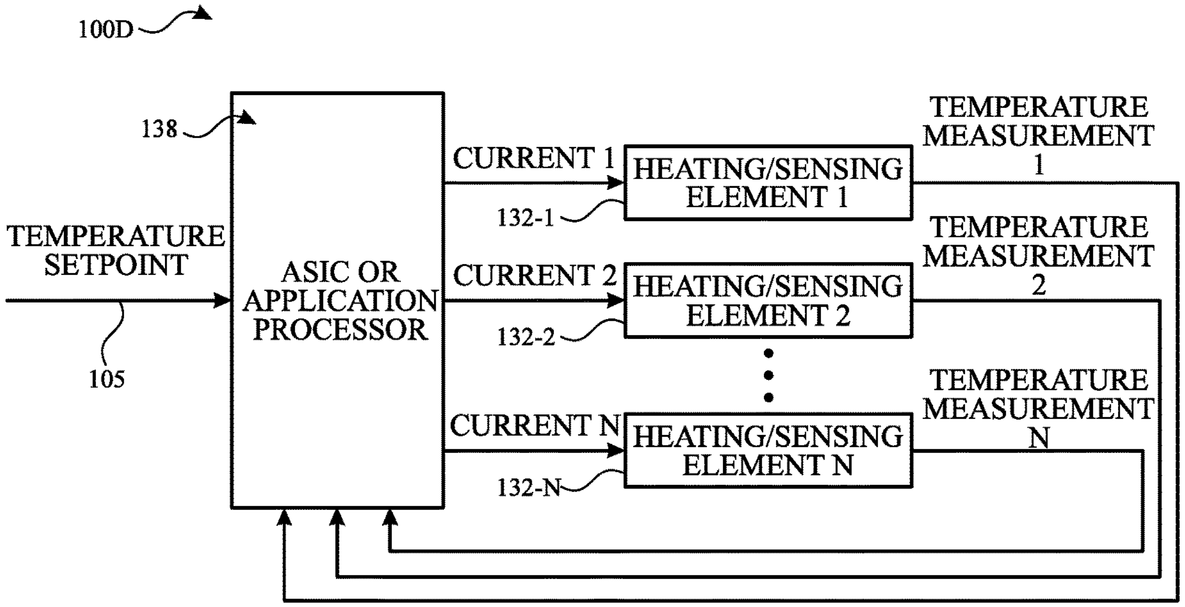
FIG. 1D illustrates a control feedback system, in accordance with various aspects of the subject technology.

FIG. 1D illustrates a control feedback system 100D, in accordance with various aspects of the subject technology. In some implementations, the control system 100D may consist of a multi-input, multi-output control feedback implemented in HW and/or software SW that can monitor temperature and adjust the drive current accordingly to control the power dissipation of each resistive element to ensure uniform heating of the MEMS sensor 140. In one or more implementations, the control system 100D includes an application processor 138, that controls a number of (e.g., N) heating and/or sensing elements 132 (132-1, 132-2 . . . 132-N). In one or more aspects, the application processor 138 can be implemented as an ASIC (e.g., ASIC 130) or can use the processing power of a processor (e.g., central processor) of a host device such as a portable communication device. The application processor 138 receives N temperature values measured by the heating and/or sensing elements 132 (hereinafter, elements 132) and provides N currents to the elements 132 based on a temperature setpoint input 105. The currents generated by the application processor 138 individually controls the power dissipation of the respective resistive elements of the elements 132 to ensure uniform heating of the MEMS sensor 140.

Figure 1E:
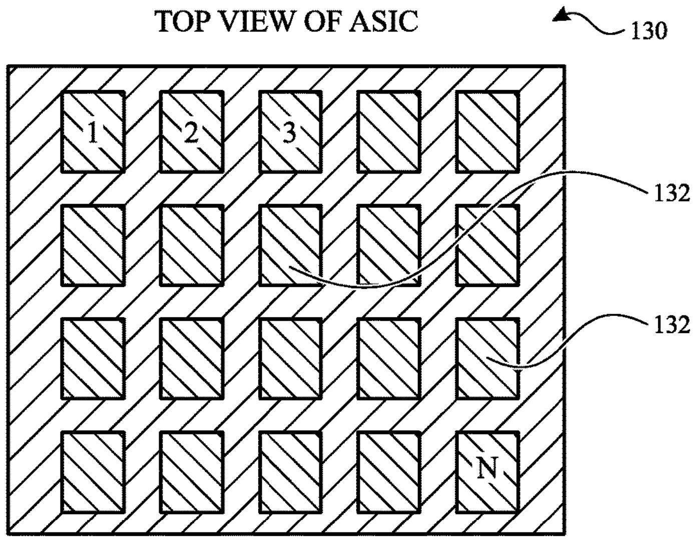
FIG. 1E illustrates a top view of an example ASIC of the enhanced MEMS sensor device of FIG. 1A, in accordance with various aspects of the subject technology.

FIG. 1E illustrates a top view of an example ASIC 130 of the enhanced MEMS sensor device of FIG. 1A, in accordance with various aspects of the subject technology. The top view shown in FIG. 1E depicts the ASIC 130 of the sensor device 100 of FIG. 1A, which includes the elements 132 (132-1, 132-2 . . . 132-N) arranged as a rectangular array, although the top view of the elements are not limited to rectangular shape and can also be arranged in a different array structure (e.g., square or circular).

Figure 2A:
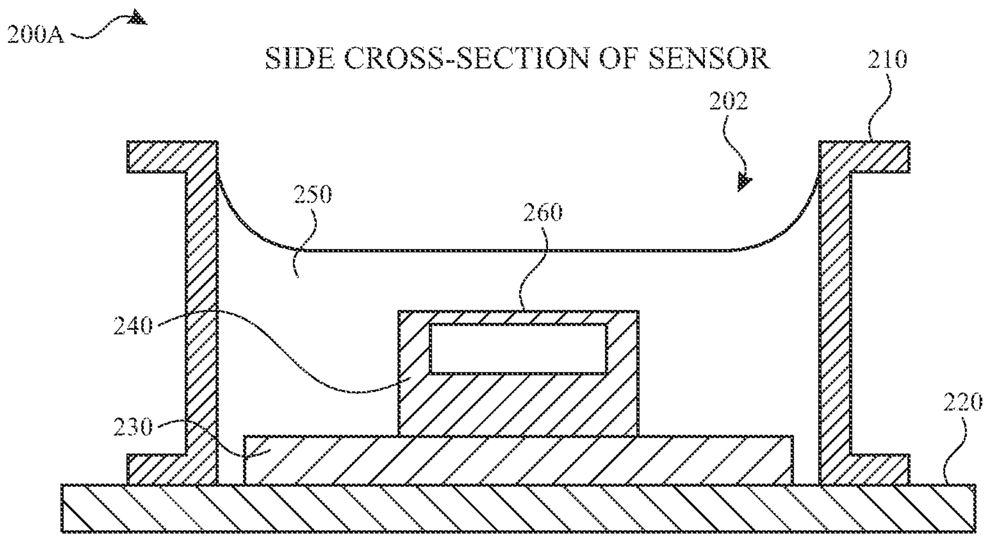
FIG. 2A illustrates a cross-sectional view of an example of an enhanced MEMS sensor device with an embedded heater, in accordance with various aspects of the subject technology.

FIG. 2A illustrates a cross-sectional view 200A of an example of an enhanced MEMS sensor device 200 with an embedded heater, in accordance with various aspects of the subject technology. The enhanced MEMS sensor device 202 (hereinafter, sensor device 202) includes a lid (housing) 210, a substrate 220, an ASIC 230, a MEMS sensor 240, a medium 250 and a MEMS sensing resistor 260. The lid 210 can be made of, but is not limited to, a metal such as aluminum, tungsten, stainless steel, or other suitable metals. In some implementations, other materials such as plastic can be used to make the lid 210. The substrate 220 can be made of glass, a semiconductor material (wafer) such as silicon or any other suitable material. The substrate 220 covers a bottom side of the sensor device 202 and includes a number of inductive heating coils. The MEMS sensor 240 can be any sensor such as a pressure sensor, a gas sensor, an environmental sensor, or other sensors for which temperature sensitivity can be an issue and temperature calibration would be important. The medium 250 is used to partially fill the lid 210 to fully cover and insulate the ASIC 230, the MEMS sensor 240 and includes small embedded metallic or magnetic particles embedded throughout the medium 250.

The ASIC 230 is placed on the substrate 220 and includes suitable circuitry (analog and/or digital) to drive the magnetic heating coils of the substrate, for example, provide power (alternating current) and control signals to the magnetic heating coils. The magnetic field generated by the magnetic heating coils can heat up metals in the field, which in this case includes the metallic particles embedded in the medium 250 and the lid 210, if it is made of a metal. The heat generated by the metallic particles is leveraged to measure, for instance, temperature sensitivity of the MEMS sensor 240 and to perform sensor calibration. The distribution of the metallic particles embedded in the medium 250 allows a uniform temperature distribution that can be adjusted by changing the material, composition, size, density and concentration of the embedded metallic particles. The MEMS sensing resistor 260 is disposed as a layer on the MEMS sensor 240 and can be used to provide additional inductive heating. In one or more implementations, the material of the MEMS sensing resistor 260 can be chosen to change its inductive heating. In some implementations, the material of the lid 210 can be metal to conduct heat or a polymer compound (e.g., plastic) to prevent heat conduction to further control the heat distribution. The uniform temperature distribution within the medium 250 would prevent thermal gradients across the ASIC 230, which can result in offsets in analog circuits implemented on the ASIC 230.

Figure 2B:
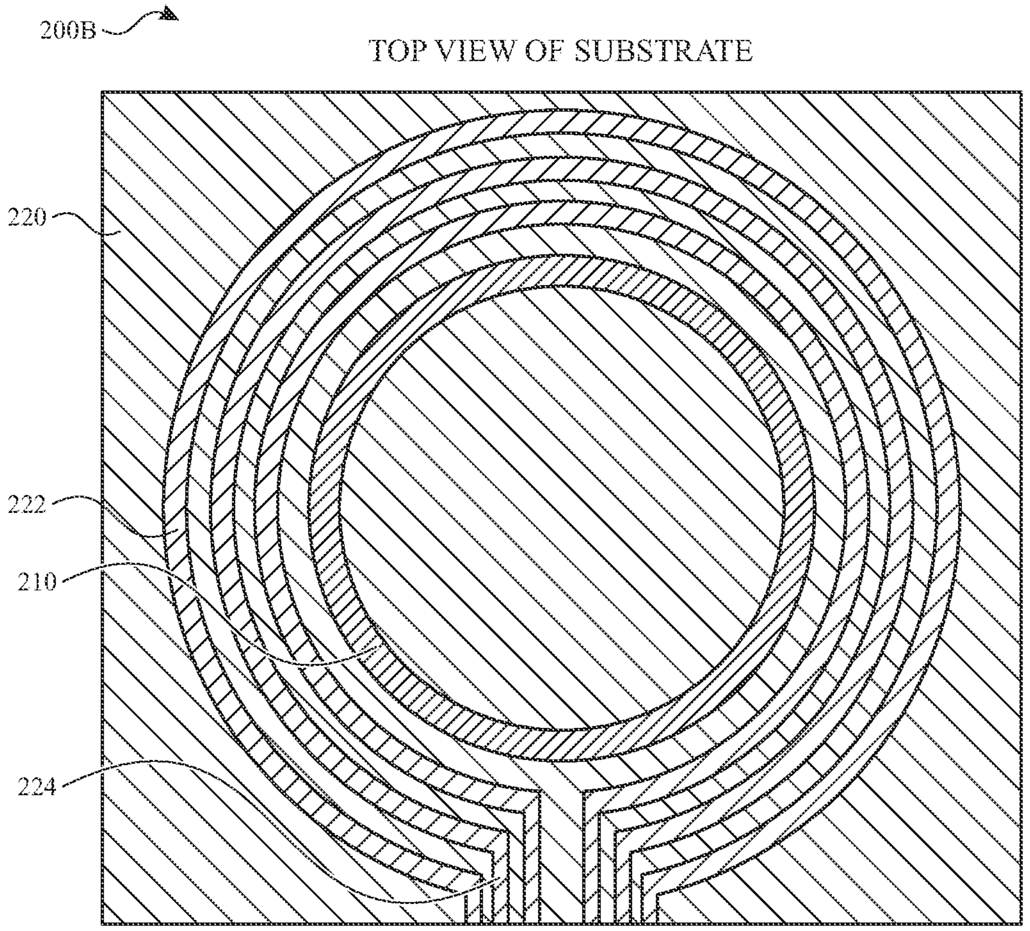
FIG. 2B illustrates a top view of an example substrate of the enhanced MEMS sensor device of FIG. 2A, in accordance with various aspects of the subject technology.

FIG. 2B illustrates a top view 200B of an example substrate 220 of the enhanced MEMS sensor device of FIG. 2A, in accordance with various aspects of the subject technology. The substrate 220 includes a number of (e.g., three) inductive heating coils 222, which have traces 224 to individual current sources. The current sources provide alternating currents to the traces 224 connected to the inductive heating coils 222, thus causing them to generate magnetic fields in a direction perpendicular to the plane of the substrate 220. Thus, the generated magnetic field would be felt by the MEMS sensing resistor 260 and the metallic particles embedded in the medium 250. The intensity and frequency of the alternating current can be adjusted by a control feedback system (not shown for simplicity) so that the sensor temperature conforms to a specified temperature profile and ensure uniform heating. In some implementations, the control system may consist of a multi-input, multi-output control feedback implemented in HD and/or SW that can monitor temperature and adjust the alternating current. Because each inductive heating coils 222 is connected to a separate current source, the current through each of the inductive heating coils 222 can be individually controlled to selectively heat parts of the sensor and improve heating uniformity. In some implementations, the characteristics of the inductive heating coils 222 such as width, thickness, material and or shape may be varied to further improve heating uniformity.

Figure 3A:
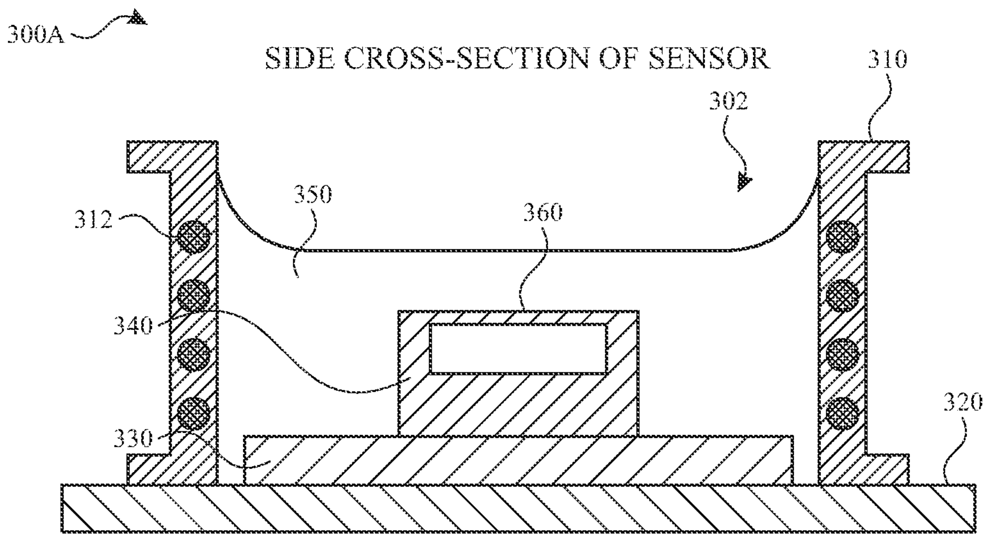
FIG. 3A illustrates a cross-sectional view of an example of an enhanced MEMS sensor device with an embedded heater, in accordance with various aspects of the subject technology.

FIG. 3A illustrates a cross-sectional view 300A of an example of an enhanced MEMS sensor device 302 with an embedded heater, in accordance with various aspects of the subject technology. The enhanced MEMS sensor device 302 (hereinafter, sensor device 302) includes a lid (housing) 310, a substrate 320, an ASIC 330, a MEMS sensor 340, a medium 350 and a MEMS sensing resistor 360. The lid 310 can be made of, but is not limited to, a polymer compound (e.g., plastic). The lid 310 includes a heating-wire element (filament) 312, which is molded inside the lid 310. Current can be applied to the heating-wire element 312 to generate heat. In some implementations, the size, shape and length of the heating-wire element 312 can be varied to achieve a uniform heating of the MEMS sensor 340. In one or more implementations, the material for the heating-wire element 312 can be, but not limited to, nichrome. The substrate 320, the ASIC 330, the medium 350 and the MEMS sensor 340 are similar to the substrate 120, the ASIC 130, the medium 150 and the MEMS sensor 140 of FIG. 1A and their further description is omitted here for brevity.

Figure 3B:
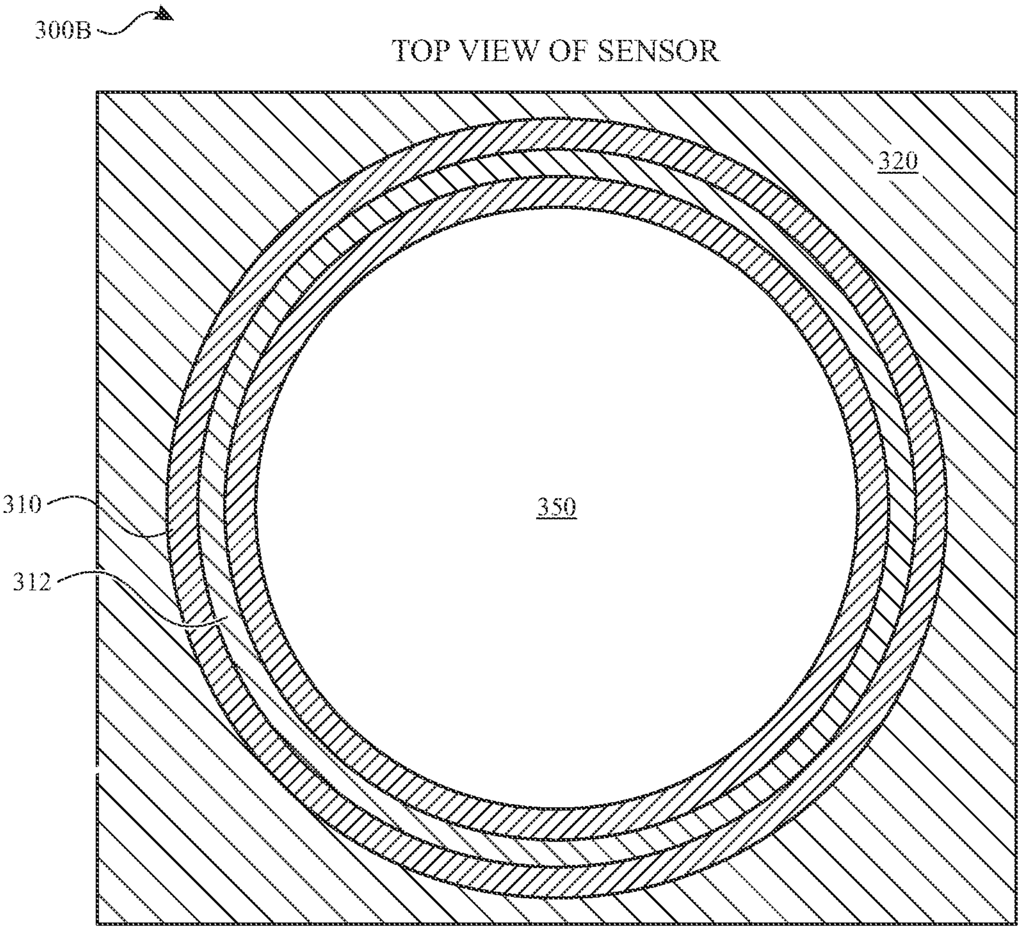
FIG. 3B illustrates a top view of an example substrate of the enhanced MEMS sensor device of FIG. 3A, in accordance with various aspects of the subject technology.

FIG. 3B illustrates a top view 300B of the sensor device 302 of FIG. 3A, in accordance with various aspects of the subject technology. The top view 300B shows the substrate 320, the lid 310, the embedded heating-wire element 312 and the medium 350 the description of which was provided above with respect to FIG. 3A.

Figure 4:
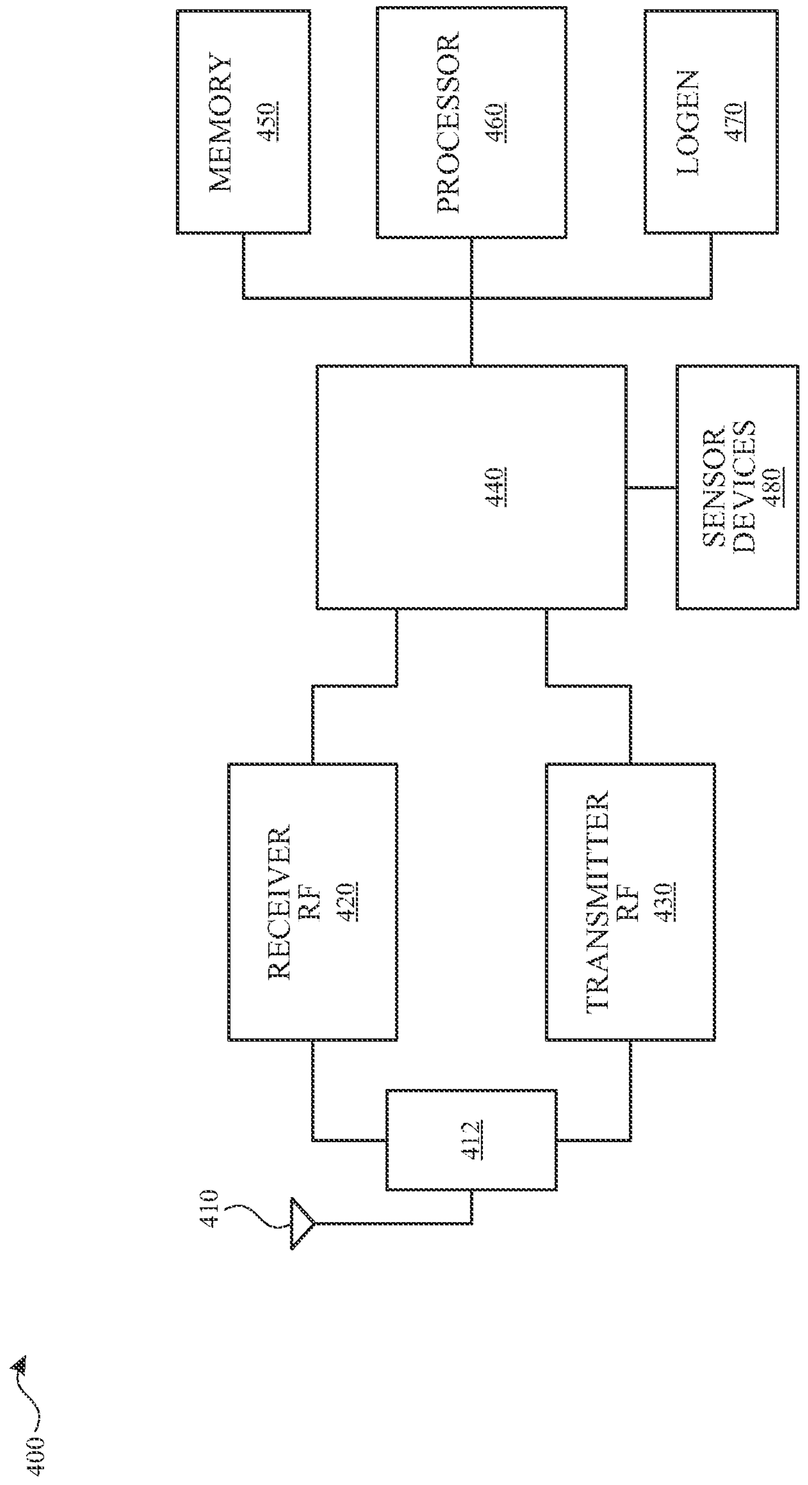
FIG. 4 illustrates a wireless communication device within which some aspects of the subject technology are implemented.

FIG. 4 illustrates a wireless communication device within which some aspects of the subject technology are implemented. In one or more implementations, the wireless communication device 400 can be a tablet, a smartphone or a smartwatch, which may use the enhanced MEMS sensor device (e.g., 102 of FIG. 1A, 202 of FIG. 2A or 302 of FIG. 3A) with an embedded heater of the subject technology. The wireless communication device 400 may comprise a radio-frequency (RF) antenna 410, a duplexer 412, a receiver 420, a transmitter 430, a baseband processing module 440, a memory 450, a processor 460, a local oscillator generator (LOGEN) 470 and a sensor device 480. In various aspects of the subject technology, one or more of the blocks represented in FIG. 4 may be integrated on one or more semiconductor substrates. For example, the blocks 420-470 may be realized in a single chip or a single system on a chip or may be realized in a multichip chipset.

The receiver 420 may comprise suitable logic circuitry and/or code that may be operable to receive and process signals from the RF antenna 410. The receiver 420 may, for example, be operable to amplify and/or downconvert received wireless signals. In various aspects of the subject technology, the receiver 420 may be operable to cancel noise in received signals and may be linear over a wide range of frequencies. In this manner, the receiver 420 may be suitable for receiving signals in accordance with a variety of wireless standards such as Wi-Fi, WiMAX, Bluetooth, and various cellular standards. In various aspects of the subject technology, the receiver 420 may not use any sawtooth acoustic wave (SAW) filters and few or no off-chip discrete components such as large capacitors and inductors.

The transmitter 430 may comprise suitable logic circuitry and/or code that may be operable to process and transmit signals from the RF antenna 410. The transmitter 430 may, for example, be operable to upconvert baseband signals to RF signals and amplify RF signals. In various aspects of the subject technology, the transmitter 430 may be operable to upconvert and amplify baseband signals processed in accordance with a variety of wireless standards. Examples of such standards may include Wi-Fi, WiMAX, Bluetooth, and various cellular standards. In various aspects of the subject technology, the transmitter 430 may be operable to provide signals for further amplification by one or more power amplifiers.

The duplexer 412 may provide isolation in the transmit band to avoid saturation of the receiver 420 or damaging parts of the receiver 420, and to relax one or more design requirements of the receiver 420. Furthermore, the duplexer 412 may attenuate the noise in the receive band. The duplexer 412 may be operable in multiple frequency bands of various wireless standards.

The baseband processing module 440 may comprise suitable logic, circuitry, interfaces, and/or code that may be operable to perform the processing of baseband signals. The baseband processing module 440 may, for example, analyze received signals and generate control and/or feedback signals for configuring various components of the wireless communication device 400, such as the receiver 420. The baseband processing module 440 may be operable to encode, decode, transcode, modulate, demodulate, encrypt, decrypt, scramble, descramble, and/or otherwise process data in accordance with one or more wireless standards.

The processor 460 may comprise suitable logic, circuitry, and/or code that may enable processing data and/or controlling operations of the wireless communication device 400. In this regard, the processor 460 may be enabled to provide control signals to various other portions of the wireless communication device 400. The processor 460 may also control transfer of data between various portions of the wireless communication device 400. Additionally, the processor 460 may enable implementation of an operating system or otherwise execute code to manage operations of the wireless communication device 400. In one or more implementations, the processor 460 can be used to control heating of the heating elements of the subject technology. For example, the processor 460 can control current fed to the resistive wires in heating element 160 of FIG. 1, the resistive traces 134 of FIG. 1B, resistive traces 144 of FIG. 1C and the alternating current provided to the inductive heating coils 222 of FIG. 2B to adjust the temperature of the MEMS sensor of the subject technology.

The memory 450 may comprise suitable logic, circuitry, and/or code that may enable storage of various types of information such as received data, generated data, code, and/or configuration information. The memory 450 may comprise, for example, RAM, ROM, flash, and/or magnetic storage. In various aspects of the subject technology, information stored in the memory 450 may be utilized for configuring the receiver 420 and/or the baseband processing module 440.

The LOGEN 470 may comprise suitable logic, circuitry, interfaces, and/or code that may be operable to generate one or more oscillating signals of one or more frequencies. The LOGEN 470 may be operable to generate digital and/or analog signals. In this manner, the LOGEN 470 may be operable to generate one or more clock signals and/or sinusoidal signals. Characteristics of the oscillating signals such as the frequency and duty cycle may be determined based on one or more control signals from, for example, the processor 460 and/or the baseband processing module 440.

In operation, the processor 460 may configure the various components of the wireless communication device 400 based on a wireless standard according to which it is designed to receive signals. Wireless signals may be received via the RF antenna 410, amplified, and downconverted by the receiver 420. The baseband processing module 440 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 400, data to be stored to the memory 450, and/or information affecting and/or enabling operation of the wireless communication device 400. The baseband processing module 440 may modulate, encode, and perform other processing on audio, video, and/or control signals to be transmitted by the transmitter 430 in accordance with various wireless standards.

In some implementations, the senor device 480 can be the enhanced MEMS sensor device with an embedded heater of the subject technology, as discussed above with respect to 102 of FIG. 1A, 202 of FIG. 2A and 302 of FIG. 3A.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Various functions described above can be implemented in digital electronic circuitry, as well as in computer software, firmware or hardware. The techniques can be implemented by using one or more computer program products. Programmable processors and computers can be included in or packaged as mobile devices. The processes and logic flows can be performed by one or more programmable processors and by one or more programmable logic circuitries. General and special-purpose computing devices and storage devices can be interconnected through communication networks.

Some implementations include electronic components such as microprocessors and storage and memory that store computer program instructions in a machine-readable or computer-readable medium (alternatively referred to as computer-readable storage media, machine-readable media, or machine-readable storage media). Some examples of such computer-readable media include RAM, ROM or flash memory. The computer-readable media can store a computer program that is executable by at least one processing unit and include sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multicore processors that execute software, some implementations are performed by one or more integrated circuits such as application-specific integrated circuits (ASICs) or field-programmable gate arrays (FPGAs). In some implementations, such integrated circuits execute instructions that are stored on the circuit itself.

As used in this specification and any claims of this application, the terms "computer," "processor," and "memory" all refer to electronic or other technological devices. These terms exclude people or groups of people. For the purposes of the specification, the terms "display" or "displaying" mean displaying on an electronic device. As used in this specification and any claims of this application, the terms "computer-readable medium" and "computer-readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback such as visual feedback, auditory feedback, or tactile feedback. Input from the user can be received in any form, including acoustic, speech, or tactile input.

Many of the above-described features and applications are implemented as software processes that are specified as a set of instructions recorded on a computer-readable storage medium (also referred to as a computer-readable medium). When these instructions are executed by one or more processing unit(s) (e.g., one or more processors, cores of processors, or other processing units), they cause the processing unit(s) to perform the actions indicated in the instructions. Examples of computer-readable media include, but are not limited to, flash drives, RAM chips, hard drives and EPROMs. The computer-readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as subparts of a larger program while remaining distinct software aspects of the subject disclosure. In some implementations, multiple software aspects can also be implemented as separate programs. Finally, any combination of separate programs that together implement a software aspect described herein is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language including compiled or interpreted languages and declarative or procedural languages, and it can be deployed in any form including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only and do not limit the subject disclosure.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects, and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations, and vice versa.

The word "example" is used herein to mean "serving as an example or illustration." Any aspect or design described herein as an "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for," or, in the case of a method claim, the element is recited using the phrase "step for." Furthermore, to the extent that the terms "include," "have," or the like are used in the description or the claims, such terms are intended to be inclusive in a manner similar to the term "comprise," as "comprise" is interpreted when employed as a transitional word in a claim.

What is claimed is:

1. An apparatus comprising:

a housing;

a substrate attached to the housing;

a sensor;

an integrated circuit mounted on the substrate; and an array of heating elements configured to adjust a temperature of the sensor to facilitate measurement of temperature sensitivity and calibration of the sensor, wherein each heating element in the array of heating elements is controlled separately to provide uniform heat distribution to the sensor.

2. The apparatus of claim 1, wherein the housing is at least partially filled with a deformable medium, and wherein the array of heating elements are embedded in the deformable medium.

3. The apparatus of claim 2, wherein the deformable medium comprises a gel and the array of heating elements comprise an array of resistive wires coupled to the integrated circuit.

4. The apparatus of claim 3, wherein the integrated circuit comprises an application-specific integrated circuit (ASIC) configured to process a signal from the sensor and provide an electrical current and one or more control signals to the array of resistive wires.

5. The apparatus of claim 4, wherein the ASIC is configured to provide the one or more control signals to individually control the electrical current provided to each resistive wire of the array of resistive wires to provide a uniform heat distribution throughout the deformable medium.

6. The apparatus of claim 1, wherein the integrated circuit comprises an ASIC and includes the array of heating elements, wherein each heating element of the array of heating elements comprises a trace of a resistive element, and wherein the ASIC provides a drive current to each heating element of the array of heating elements and adjusts the drive current separately between different heating elements to control a power dissipation of respective resistive elements.

7. The apparatus of claim 1, wherein the housing is at least partially filled with a deformable medium embedded with magnetic particles.

8. The apparatus of claim 7, wherein the substrate includes a plurality of inductive heating coils individually powered and controlled and configured to generate a magnetic field to heat the magnetic particles.

9. The apparatus of claim 8, wherein the sensor comprises a microelectro-mechanical system (MEMS) sensor, and wherein the sensor includes a layer of a sensing resistor that is heated by electrical current generated by an ASIC configured to process signal from the sensor.

10. The apparatus of claim 1, wherein the housing is made of a polymer compound and includes a heating wire configured to heat the sensor when fed with an electric current.

11. A portable communication device comprising:

a processor; and a sensor device comprising:

a lid housing a sensor and an integrated circuit;

a substrate; and an array of heating elements configured to adjust a temperature of the sensor to facilitate measurement of temperature sensitivity and calibration of the sensor, wherein each heating element in the array of heating elements is controlled separately to provide uniform heat distribution to the sensor, and wherein the sensor is disposed on the integrated circuit and the integrated circuit is mounted on the substrate.

12. The portable communication device of claim 11, wherein the lid is at least partially filled with a gel embedding the array of heating elements.

13. The portable communication device of claim 12, wherein the array of heating elements comprise an array of resistive wires individually fed with electrical currents, wherein an intensity of an electric current fed to each wire of the array of resistive wires is controlled by the processor.

14. The portable communication device of claim 12, wherein the array of heating elements comprise magnetic particles distributed within the gel and are configured to heat up in a magnetic field.

15. The portable communication device of claim 14, wherein the substrate includes a plurality of inductive heating coils individually powered and controlled by the processor and configured to generate a magnetic field to heat the magnetic particles.

16. The portable communication device of claim 11, wherein the integrated circuit comprises an ASIC and includes the array of heating elements, wherein each heating element of the array of heating elements comprises a trace of a resistive element.

17. The portable communication device of claim 11, wherein the sensor comprises a microelectro-mechanical system (MEMS) sensor, and wherein the sensor includes a layer of a sensing resistor that is heated by a magnetic field.

18. The portable communication device of claim 11, wherein the lid is made of a polymer compound and includes a heating wire configured to heat the sensor when fed with an electric current.

19. A system comprising:

a pressure sensor device comprising:

a housing sealed with a substrate layer at one end and partially filled with a deformable medium;

an application-specific integrated circuit (ASIC) mounted on the substrate layer;

a microelectro-mechanical system (MEMS) sensor disposed on the ASIC; and an array of heating elements configured to adjust a temperature of the MEMS sensor to facilitate measurement of temperature sensitivity and calibration of the MEMS sensor, wherein each heating element in the array of heating elements is controlled separately to provide uniform heat distribution to the sensor; and a processor configured to control heating of the array of heating elements.

20. The system of claim 19, wherein the array of heating elements comprise one or more of:

an array of resistive wires embedded within the deformable medium and individually connected to the ASIC, an array of resistive traces embedded within the ASIC, a plurality of magnetic particles distributed within the deformable medium and configured to be heated in a magnetic field, one or more hearing wires molded into the housing, and a layer of a sensing resistor configured to be heated in the magnetic field, wherein the magnetic field is generated by one or more magnetic coils implemented as traces on the substrate layer.

* * * * *